United States Patent
Wikus et al.

(10) Patent No.: US 9,982,840 B2
(45) Date of Patent: May 29, 2018

(54) COOLING DEVICE WITH CRYOSTAT AND COLD HEAD HAVING REDUCED MECHANICAL COUPLING

(71) Applicant: Bruker BioSpin GmbH, Rheinstetten (DE)

(72) Inventors: Patrick Wikus, Linkenheim-Hochstetten (DE); Steffen Bonn, Karlsruhe (DE); Heinrich Harsch, Stutensee (DE)

(73) Assignee: Bruker BioSpin GmbH, Rheinstetten (DE)

( * ) Notice: Subject to any disclaimer, the term of this patent is extended or adjusted under 35 U.S.C. 154(b) by 648 days.

(21) Appl. No.: 14/855,401

(22) Filed: Sep. 16, 2015

(65) Prior Publication Data

US 2016/0091142 A1    Mar. 31, 2016

(30) Foreign Application Priority Data

Sep. 30, 2014   (DE) ........................ 10 2014 219 849

(51) Int. Cl.

| | |
|---|---|
| *F17C 3/08* | (2006.01) |
| *F25D 19/00* | (2006.01) |
| *G01R 33/31* | (2006.01) |
| *G01R 33/46* | (2006.01) |
| *G01R 33/38* | (2006.01) |
| *G01R 33/3815* | (2006.01) |
| *F25B 9/14* | (2006.01) |

(52) U.S. Cl.
CPC .............. *F17C 3/085* (2013.01); *F25D 19/00* (2013.01); *G01R 33/31* (2013.01); *G01R 33/3804* (2013.01); *G01R 33/3815* (2013.01); *G01R 33/46* (2013.01); *F25B 9/145* (2013.01); *F25B 2500/13* (2013.01)

(58) Field of Classification Search
CPC ........... F17C 3/08; F25D 19/00; G01R 33/31; G01R 33/46; G01R 33/38; G01R 33/3815; F25B 9/14
See application file for complete search history.

(56) References Cited

U.S. PATENT DOCUMENTS

| | | | |
|---|---|---|---|
| 5,018,359 A | 5/1991 | Horikawa | |
| 5,178,357 A | 1/1993 | Platus | |
| 5,446,433 A * | 8/1995 | Laskaris | G01R 33/3815 335/216 |
| 5,744,959 A | 4/1998 | Jeker | |
| 5,782,095 A * | 7/1998 | Chen | G01R 33/3815 62/47.1 |

(Continued)

*Primary Examiner* — G. M. Hyder
(74) *Attorney, Agent, or Firm* — Paul Vincent

(57) ABSTRACT

A cooling device (20) has a cryostat (23) and a cold head (1), in particular, the cold head (1) of a pulse tube cooler. The cryostat (23) has a vacuum container (4) with a vacuum container wall (4a), wherein the vacuum container wall (4a) seals off a vacuum inside the vacuum container (4) from the environment. A flexible sealing section (6) connects the vacuum container wall (4a) directly or indirectly to the room temperature part (1a) of the cold head (1). The flexible sealing section (6) seals off the inside of the cryocontainer (2) from the environment. The cooling device further reduces mechanical coupling between the cold head and the cryostat, in particular, in order to enable performance of NMR measurements with fewer disturbances due to external vibrations.

22 Claims, 4 Drawing Sheets

(56) References Cited

U.S. PATENT DOCUMENTS

| | | | |
|---|---|---|---|
| 5,966,944 A * | 10/1999 | Inoue | F25B 9/145 62/51.1 |
| 6,181,228 B1 * | 1/2001 | Laskaris | F17C 3/085 335/300 |
| 7,287,387 B2 | 10/2007 | Kirichek | |
| 2007/0051115 A1 | 3/2007 | Kraus | |
| 2012/0073310 A1 | 3/2012 | Radovinsky | |
| 2014/0048989 A1 | 2/2014 | Platus | |
| 2014/0202174 A1 | 7/2014 | Wang | |

* cited by examiner

COOLING DEVICE WITH CRYOSTAT AND COLD HEAD HAVING REDUCED MECHANICAL COUPLING

This application claims Paris convention priority from DE 10 2014 219 849.6 filed Sep. 30, 2014, the entire disclosure of which is hereby incorporated by reference.

BACKGROUND OF THE INVENTION

The invention concerns a cooling device comprising a cryostat and a cold head, in particular the cold head of a pulse tube cooler, the cryostat comprising a vacuum container with a vacuum container wall, wherein the vacuum container wall seals off a vacuum inside the vacuum container from the environment, and a cryocontainer for a cryogenic liquid and/or a cryogenic gas, having a cryocontainer wall, wherein the cryocontainer is arranged inside the vacuum container and the cryocontainer wall seals off the inside of the cryocontainer from the vacuum of the vacuum container, wherein a room temperature part of the cold head is mounted in a vibration-damped fashion to the vacuum container wall by means of decoupling elements and a cooling arm of the cold head projects into an access opening of the cryostat to the cryocontainer along a longitudinal axis, and wherein a flexible sealing section is provided which connects the vacuum container wall directly or indirectly to the room temperature part of the cold head.

A cooling device of this type is disclosed in U.S. Pat. No. 7,287,387 B2.

Nuclear magnetic resonance (NMR) apparatus, in particular NMR spectrometers and NMR tomographs, require strong magnetic fields which are often generated by means of superconducting magnet coils. The superconducting magnet coils must be operated at a cryogenic temperature. For this reason, the magnet coils are typically arranged in the cryotank of a cryostat which is filled with a cryogenic liquid, e.g. liquid helium. In order to maintain the operating temperature on a long-term basis and at the same time minimize the consumption of cryogenic liquids, the cooling arm of a cold head projects into the cryotank which withdraws heat. The cryotank is surrounded by a vacuum tank for thermal insulation.

NMR measurements can be disturbed by mechanical vibrations of the NMR apparatus which are introduced, in particular, via the cold head mounted to the cryostat.

In case of cooling in accordance with the pulse tube cooling principle which is often applied, periodic pressure fluctuations of a working gas are established in the cold head. For this purpose, a control valve alternately connects a high-pressure reservoir and a low-pressure reservoir of the working gas to the cold head. The change-over frequency of the control valve is typically approximately 1 to 2 Hz. Disturbing vibrations at the cold head also occur with other cooling principles (e.g. Stirling, Gifford-McMahon).

EP 0 780 698 A1 describes an NMR device with mechanical decoupling between a cooling means and a cryotank.

U.S. Pat. No. 7,287,387 B2 discloses an apparatus for cooling superconducting magnets, wherein a two-stage cold head projects into an inner chamber which is filled with helium and is surrounded by a vacuum chamber. The room temperature part of the cold head is mounted to a cold head flange which is mounted to the vacuum chamber via springs. For sealing off the vacuum tank from the environment, a bellows is arranged between the cold head flange and the outer wall of the vacuum chamber. Bellows are also provided for connecting the cold head flange to the wall of the inner chamber in order to seal the vacuum tank with respect to the inner chamber. The oscillating mounting of the cold head on the springs minimizes introduction of vibrations to the vacuum chamber due to fastening of the cold head on the vacuum chamber. However, the unilaterally pressurized bellows, which are used for sealing the vacuum chamber and the inner chamber, still cause non-negligible mechanical coupling between the cold head and the vacuum chamber and between the cold head and the inner chamber.

U.S. Pat. No. 5,018,359 discloses a cryogenic cooling apparatus, in which a cold head is mounted to a magnetic shield and one cooling arm of the cold head projects into a vacuum container, wherein the cooling stages are coupled to two radiation shields. A bellows is used between a flange at the cold head and an outer wall of the vacuum container for sealing off the vacuum from the environment. Also in this case, the unilaterally pressurized bellows causes non-negligible mechanical coupling with the cold head.

DE 10 2004 034 729 B4 discloses a cryostat configuration, wherein a cold head is mounted via springs to the outer wall of the cryostat. One cooling arm of the cold head projects into a neck tube of a helium container. In order to establish thermal coupling between an upper cooling stage of the cooling arm and a radiation shield, finned coupling surfaces are provided between which a gas gap remains.

It is the underlying purpose of the invention to present a cooling device, in which mechanical coupling between the cold head and the cryostat is further reduced, in particular, in order to enable performance of NMR measurements with fewer disturbances caused by external vibrations.

SUMMARY OF THE INVENTION

This object is achieved in a surprisingly simple and effective fashion by a cooling device of the above-mentioned type, which is characterized in that the flexible sealing section seals off the inside of the cryocontainer from the environment.

In the inventive cooling device, the cold head is mounted in a vibration-damped fashion to the vacuum container wall by means of the decoupling elements such that practically no vibrations are introduced by the cold head into the vacuum container due to the fastening as such. Since the cooling arm projects into the access opening or into the cryocontainer, the access opening or the cryocontainer must be sealed such that the coolant (the cryogenic liquid or the associated gas) inside the cryocontainer does not get lost or become soiled.

In addition to the cold head inserted into the access opening (including any elements that are rigidly connected to the cold head), the access opening is also sealed by the flexible sealing section. In accordance with the invention, the latter seals off the inside of the cryocontainer, in which the at least partially gaseous coolant is stored, from the environment which contains air. In correspondence therewith, a gas pressure prevails on each of the two sides of the flexible sealing section, wherein the gas pressure of the cryocontainer and the gas pressure of the environment at least partially compensate for each other at the flexible sealing section. The pressure difference between the two sides is typically between 0 mbar and 50 mbar, often 25 mbar or less, wherein the slightly higher gas pressure is established in the cryocontainer. This prevents or at least minimizes mechanical tension on the flexible sealing section due to gas pressure differences. If the cold head vibrates, the flexible sealing section can then substantially freely vibrate, thereby minimizing transfer of vibrations to the cryostat. This, in turn, minimizes disturbances of NMR measurements using a cooling device having a superconducting magnet in the cryocontainer.

The only mechanical connections between the cold head and the cryostat are preferably realized via one or more flexible sealing sections which are subjected to the gas pressure of the cryocontainer and also to the ambient pressure, and via the decoupling elements. In accordance with the invention, there is, in particular, no mechanical connection between the cold head and the cryostat via flexible sealing elements which are subjected to a vacuum and also to the ambient pressure or the gas pressure of the cryocontainer and would cause substantial mechanical coupling due to the required solidity and the resulting mechanical tension.

In accordance with the invention, the cold head (including all elements that are rigidly connected to the cold head) is not engaged in sealing the vacuum container. Rather, the vacuum container is sealed in a gas-tight fashion independently of the cold head (and all elements that are rigidly connected to the cold head). It is accordingly not necessary to establish a flexible sealing section for sealing off the vacuum container from the environment or from the cryocontainer. The vacuum container or its wall can therefore be designed to be completely rigid.

In summary and in accordance with the invention, the flexible sealing section connects the room temperature part of the cold head in a gas-tight fashion to the cryostat (generally in the area of transition from the cryocontainer wall to the vacuum container wall), wherein ambient pressure prevails on the outside of the sealing section (usually approximately 1000 mbar) and the pressure of the cryocontainer prevails on the inner side (usually approximately 1020 mbar, wherein the cryocontainer contains the cryogenic liquid and above it the associated gas, e.g. helium or nitrogen). Due to the small pressure difference, the sealing section may be established to be very flexible and substantially without mechanical tension, which enables very low mechanical coupling between the cold head and the vacuum container.

In one preferred embodiment of the inventive cooling device, the cryocontainer contains liquid helium and also gaseous helium at a pressure of between 950 mbar and 1100 mbar, preferably between 1015 mbar and 1050 mbar. By using helium as the coolant, temperatures of 4.2 K can be obtained in the cryocontainer. The helium pressure in the cryocontainer (including the parts that belong to the cryocontainer close to the access opening of the cryostat, e.g. a neck tube) is typically kept constant, wherein the helium pressure is selected to be slightly above the ambient pressure (or its expected range of variation). The latter also counteracts contamination of helium by air. An alternative cryogenic liquid or an alternative gas is nitrogen.

In another preferred embodiment, the flexible sealing section connects a first mounting section on the vacuum container wall and a second mounting section on the room temperature part of the cold head which are arranged at approximately the same level with respect to the longitudinal axis. In other words, the flexible sealing section establishes a seal transverse to the longitudinal axis, wherein the longitudinal axis normally extends in a vertical direction, which normally results in a horizontal seal. This prevents temperature gradients along the sealing material and therefore prevents the sealing material from getting brittle.

In one preferred embodiment, the vacuum container wall is designed to be completely rigid. This is particularly simple, stable and safe. The cryocontainer moreover has no or only a few low-frequency vibration modes, which is preferred in order to prevent interferences with NMR measurements.

In one advantageous embodiment, the flexible sealing section is formed by a plastic diaphragm of an elastomeric material, in particular of rubber. Plastic diaphragms are robust and inexpensive to produce.

In another preferred embodiment, the flexible sealing section is designed as a rolling diaphragm. This has turned out to be favorable in practice. A rolling diaphragm establishes a relatively long flexible sealing section in a relatively small space, the sealing section providing good isolation of typical vibrations, e.g. around 1 to 2 Hz.

In one preferred embodiment, a radiation shield is arranged in the vacuum container between the vacuum container wall and the cryocontainer wall, and a cooling stage of the cooling arm is thermally coupled to the radiation shield, wherein a first coupling element with a first coupling surface is formed on the cooling stage of the cooling arm, and a second coupling element with a second coupling surface is formed on the radiation shield, wherein the two coupling surfaces are located opposite to each other in the cryocontainer, wherein, however, a gap remains between the first and the second coupling element. Sufficient heat exchange can take place between the two coupling elements via the (tight) gap (mainly via the gas located between the gap) in order to cool the radiation shield, at the same time preventing mechanical coupling of the cold head to the radiation shield. This further contributes to preventing vibrations in the cryostat. It should be noted that, in addition to the cooling stage coupled to the radiation shield, there is usually a further, colder cooling stage on the cooling arm which is used for actually cooling the coolant (e.g. by reliquefaction of the gaseous coolant). The coupling elements are typically of annular design.

In an advantageous further development of this embodiment, the first coupling surface has axial projections and/or recesses and the second coupling surface has mirror-inverted axial recesses and/or projections in order to increase thermal coupling. The projections and recesses increase the coupling surface areas within a small region. Usually 2 to 4 projections or 2 to 4 recesses per coupling surface are provided.

The first coupling surface advantageously has an axially symmetrical toothing with annular axial projections and recesses, and the second coupling surface has a mirror-inverted, axially symmetrical toothing with annular axial recesses and projections. The axial symmetry prevents misalignment of the coupling surfaces due to rotation of the cold head about the longitudinal axis. It should be noted that the axial projections typically have an axial height of 1 cm to 5 cm.

Each annular axial projection and recess preferably has a triangular shape in longitudinal section, in particular, with an angle of inclination with respect to the longitudinal axis of between 10° and 30°. This has turned out to be useful in practice, in particular, for preventing contact between the cold head (or first coupling element) and the cryocontainer wall (or second coupling element) in case of vibrations of the cold head transversely to the longitudinal direction. 2 to 4 teeth per coupling element are typically provided.

In another preferred further development, when the cold head is not deflected, the gap width in that direction in which the separation between the first and the second coupling surface is minimum is between 0.8 mm and 4.0 mm. With this gap width, there is generally sufficient play for the cold head in order to prevent contact with the cryocontainer wall and on the other hand there is sufficient thermal coupling between the coupling surfaces.

In another preferred embodiment, the decoupling elements that are loaded by the cold head have an eigenfrequency f0, with f0≤0.75 Hz, preferably f0≤0.5 Hz. These eigenfrequencies have values sufficiently below the typical external disturbance frequency due to pressure fluctuations in pulse tube coolers (approximately 1.5 Hz) in order to effectively isolate them. f0 is preferably substantially smaller than $1/(2^{0.5})*\text{fext}$ with fext: external disturbance frequency, in particular change-over frequency of a control valve of a pulse tube cooler to which the cold head belongs. f0 is generally set to be smaller than $0.5/(2^{0.5})*\text{fext}$.

In accordance with a preferred embodiment, the decoupling elements minimize excitation of the cryostat by the cold head in only two orthogonal directions perpendicular to the longitudinal axis and a connecting line from a control valve to the cold head is arranged to be exclusively straight and perpendicular to the longitudinal axis. The cold head is designed to be immovable with respect to the cryostat in the longitudinal direction. The orientation of the connecting line prevents introduction of vibrations along the longitudinal axis. The embodiment is inexpensive to construct.

In one alternative advantageous embodiment, the decoupling elements minimize excitation of the cryostat by the cold head both in two orthogonal directions perpendicular to the longitudinal direction and also movement of the cold head parallel to the longitudinal direction. This damps all types of introduced vibrations irrespective of the orientation of a connecting line from a control valve to the cold head.

In one preferred further development of this embodiment, a compensation chamber is established on the cooling device, which is delimited by a rigid wall part, a further flexible sealing section, in particular a further rolling diaphragm, and a pressure plate held by means of the flexible sealing section, wherein the rigid wall part is rigidly connected to the vacuum container wall of the cryostat, wherein the pressure plate is mechanically coupled to the cold head along the longitudinal axis or is formed by the cold head, wherein the pressure plate is located opposite a room temperature flange surface of the cold head which also seals the access opening, and that means are provided for adjusting the pressure in the compensation chamber in dependence on the pressure in the cryocontainer, in particular, to be equal to the pressure in the cryocontainer. This construction compensates for ambient air pressure fluctuations, e.g. due to weather changes. The cold head is subjected to a small force by the gas pressure in the cryocontainer which (generally) tries to force the cold head out of the access opening. The amount of this force depends on the pressure difference between the cryocontainer and the surroundings. A counter force can be exerted on the cold head via the pressure plate and the gas pressure in the compensation chamber in order to keep it in a constant position (with respect to the longitudinal axis) with respect to the cryostat.

The means advantageously comprise a pressure compensation line which connects the cryocontainer to the compensation chamber. In this way, the pressure in the compensation chamber can be established in dependence on the gas pressure in the cryocontainer in a very simple and inexpensive fashion. If the pressure compensation line has a sufficiently large cross-section, the pressure in the compensation chamber is then approximately equal to the pressure in the cryocontainer.

The surface of the pressure plate and the room temperature flange surface of the cold head are preferably equal in size and are arranged parallel to one another. For this reason, the gas-pressure-induced forces on both sides of the cold head can be easily cancelled.

The pressure plate is advantageously separate from the cold head and a rolling means, which is formed, in particular, by one single bearing ball or a plurality of bearing balls, is arranged between the pressure plate and a rear side of the cold head. The rolling means permits rotation of the cold head with respect to the pressure plate about the longitudinal axis and mainly a simple tilting motion of the cold head with respect to the pressure plate or on the cryostat, thereby realizing particularly good isolation of the vibrations of the cold head. In case of one single bearing ball, the cold head can be tilted about any tilting axis perpendicular to the longitudinal direction. The rolling means may also comprise a plurality of bearing balls, e.g. three bearing balls or a ball bearing race.

In one preferred embodiment, a connecting line between a control valve and the cold head is connected at a contact point to the cold head, wherein the contact point is spaced apart from a center of gravity of the cold head in the direction of the longitudinal axis away from the first coupling element. In this way, the vibration amplitude of the cold head can be minimized, in particular in the area of toothed coupling surfaces. It should be noted that for determining an optimum position of the contact point with respect to the direction of the longitudinal axis, the behavior of the decoupling elements should be taken into consideration. If necessary, an optimum position of the contact point can be determined through experiments.

In another advantageous embodiment, the cold head comprises the cooling stage and a further, colder cooling stage, wherein the cooling stage is substantially at the position of a radiation shield in the direction of the longitudinal axis and the further colder cooling stage projects deeper into the cryocontainer than the cooling stage. The radiation shield which is arranged in the vacuum container and surrounds the cryocontainer reduces the heat input into the cryocontainer. The arrangement of the cooling stage at the position of the radiation shield realizes a compact construction and thermal coupling of the radiation shield to the cooling stage can be efficiently realized via the short distance. The further cooling stage realizes efficient reliquefaction of the cryogenic liquid.

In another advantageous embodiment, the decoupling elements are designed as "negative stiffness" isolating elements. The "negative stiffness" isolating elements may be designed, in particular, as described in US 2014/0048989 A1 or also in U.S. Pat. No. 5,178,357 A. These decoupling elements show great deflection upon weak excitation and may be designed with eigenfrequencies of 1 Hz and less, in particular also in a range of 0.4 Hz and less, which can hardly be achieved with conventional metal springs or rubber bearings in a similarly compact construction. Decoupling elements on the basis of air suspension may e.g. alternatively also be used.

The present invention also concerns the use of an inventive, above-described cooling device in an NMR measurement configuration, wherein the cryocontainer contains a magnet coil, wherein a sample is arranged in a room temperature bore of the cryostat, and wherein the sample is subjected to an NMR measurement, in particular, wherein an NMR spectrum of the sample is recorded. The magnet coil, which may be wound with a high-temperature superconducting material and/or a low-temperature superconducting material, is cooled by the cryogenic liquid in the cryocontainer, wherein the cold head maintains the operating temperature of the cryogenic liquid without disturbing the NMR measurement due to introduced vibrations.

Further advantages of the invention can be extracted from the description and the drawing. The features mentioned above and below may be used in accordance with the invention either individually or collectively in arbitrary combination. The embodiments shown and described are not to be understood as exhaustive enumeration but have exemplary character for describing the invention.

The invention is illustrated in the drawing and is explained in more detail with reference to embodiments. In the drawing:

DESCRIPTION OF THE PREFERRED EMBODIMENT

Figures 1A, 1B:
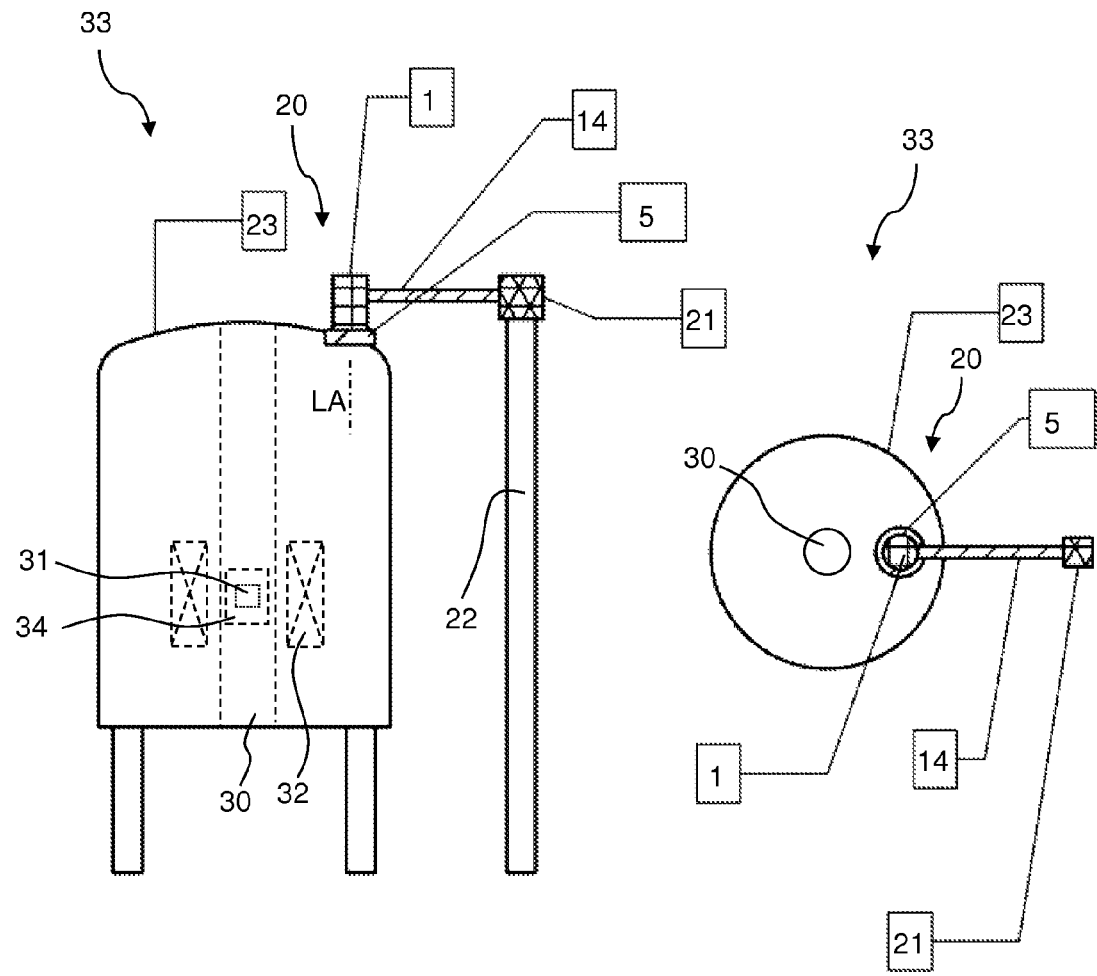
FIGS. 1a-1b show a schematic side view (FIG. 1a) and a schematic top view (FIG. 1b) of an NMR measurement configuration comprising an inventive cooling device and a control valve which is arranged at a separation therefrom.

FIGS. 1a and 1b illustrate a side view and a top view of an NMR measurement configuration 33 comprising an inventive cooling device 20.

Figure 2A:
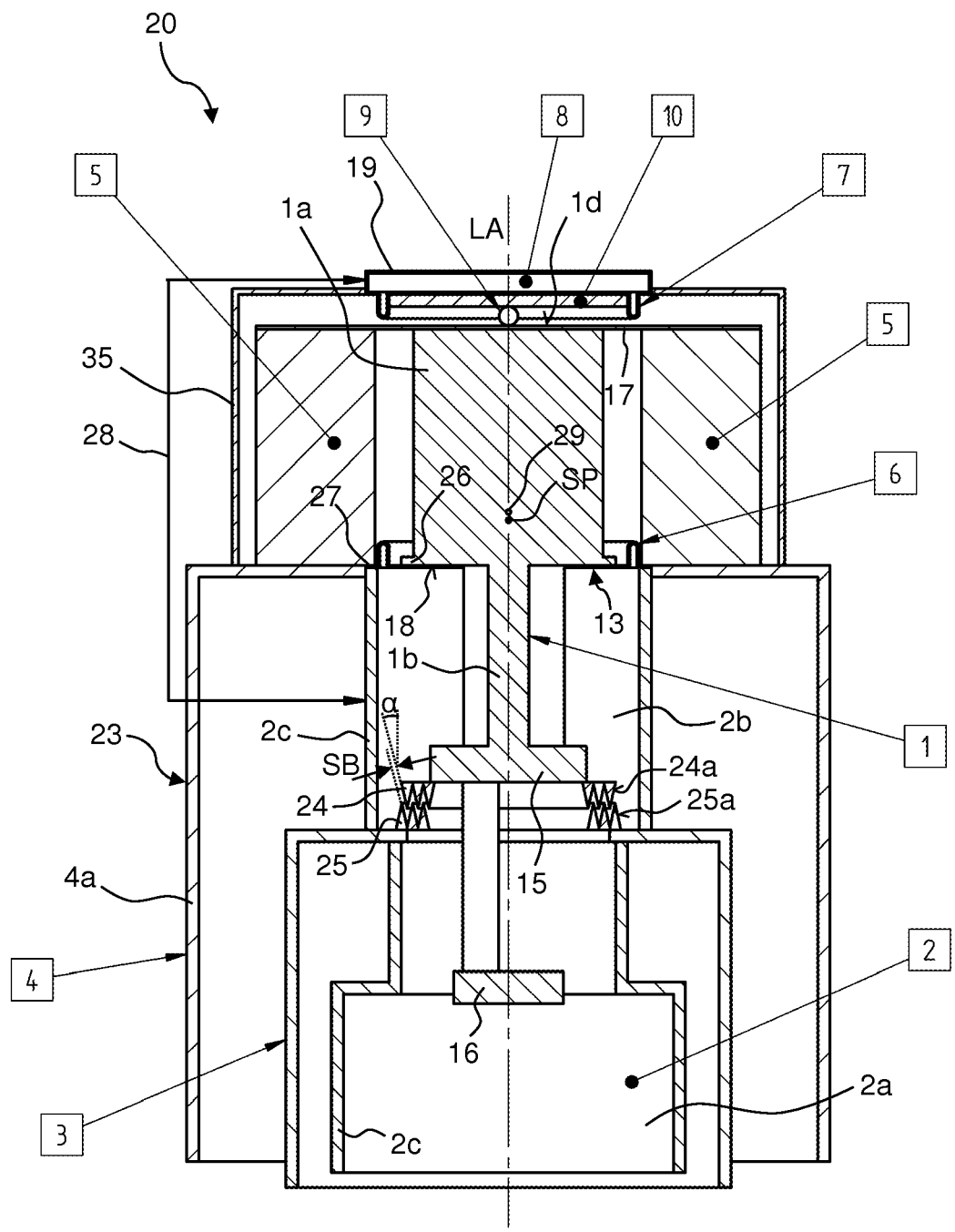
FIGS. 2a-2b show a schematic longitudinal section (FIG. 2a) and a schematic, partially cut inclined view (FIG. 2b) of an embodiment of an inventive cooling device with compensation chamber.
Figure 2B:
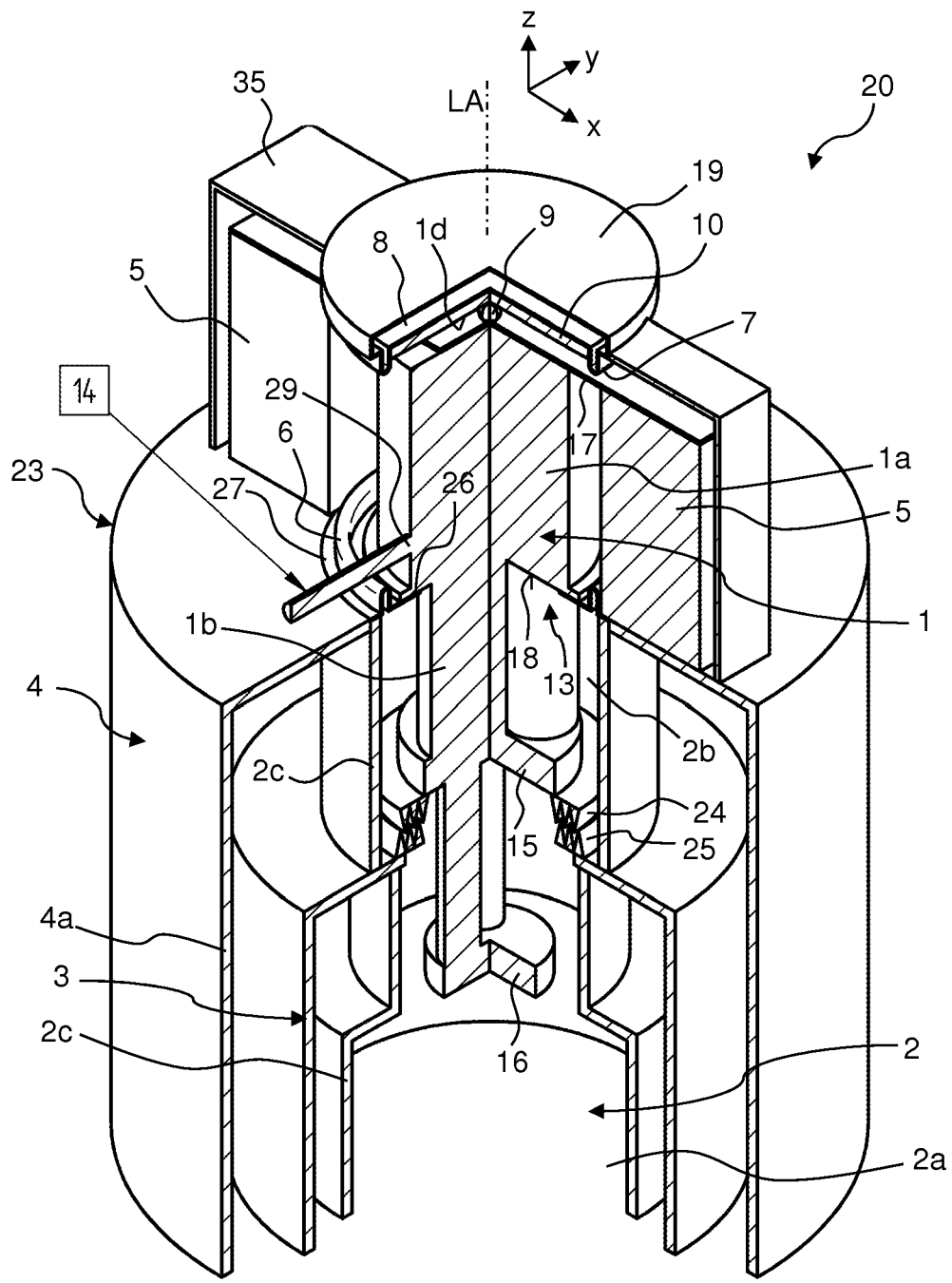

The cooling device 20 comprises a cryostat 23 and a cold head 1, in the present case of a pulse tube cooler, wherein one cooling arm of the cold head 1 is inserted into an access opening of the cryostat 23 (the latter is not shown, cf. in this connection FIGS. 2a, 2b). The cold head 1 is mounted to the outside of the cryostat 23 via decoupling elements 5. The cold head 1 is moreover connected to the control valve 21 via a connecting line 14.

A separate control valve 21 on a support 22 alternately connects a low pressure reservoir and a high-pressure reservoir (not shown) of a working gas to the cold head 1 with a frequency of approximately 1 to 2 Hz via a connecting line 14, thereby cooling the cold head 1. In this case, the connecting line 14 is guided in a straight line and perpendicular to a (in the present case vertical) longitudinal axis LA of the cold head 1, along which its cooling arm extends.

The cryostat 23 has a room temperature bore 30 which accommodates a sample 31 to be measured. A superconducting magnet coil 32 generates a strong homogeneous magnetic field $B_0$ at the location of the sample 31. RF pulses are irradiated into the sample 31 by means of radio frequency (RF) resonators 34 and the RF reaction of the sample 31 is read out.

FIGS. 2a and 2b show a longitudinal section and a partially cut inclined view of an embodiment of a cooling device 20 in the area of the cold head 1 as it can be used e.g. in the configuration of FIG. 1. It should be noted that FIGS. 2a, 2b only show a small section of the cryostat 23 and, in particular, parts of the cryostat 23 that are located further below are omitted in each case for reasons of simplification.

The cooling device 20 comprises a cold head 1 with a room temperature part 1a and a cooling arm 1b. The cooling arm 1b projects along a longitudinal axis LA into an access opening 13 of the cryostat 23 which leads into a cryocontainer 2. The room temperature part is mounted in a vibration-damped fashion on an outer side of the cryostat 23, namely on a vacuum container wall 4a via rods 17 and decoupling elements 5. In the illustrated embodiment, vibrations in two orthogonal directions x, y which are directed perpendicularly to the longitudinal axis LA, as well as vibrations which are directed in a direction z along the longitudinal axis LA are thereby isolated from the cryostat 23. In the present case, the decoupling elements 5 are designed as "negative stiffness" isolating elements.

The cryocontainer 2 is filled at least in part with a cryogenic liquid, e.g. liquid helium (not shown in detail) and located thereabove in the cryocontainer 2 is the associated gas, e.g. gaseous helium. It should be noted that the cryocontainer 2 comprises a lower main part 2a in which a superconducting magnet coil for an NMR measurement is arranged (not shown in detail, cf. in this connection FIG. 1a) and an upper neck-tube like part 2b into which the cooling arm 1b projects.

The access opening 13 is sealed by the lower side of the room temperature part is of the cold head 1 and a flexible sealing section 6 which is designed in the present case as rolling diaphragm. The flexible sealing section 6 is fastened at the outside to a first mounting section 27 of the vacuum container wall 4a (which merges here into the cryocontainer wall 2c) and at the inside to a second mounting section 26 of the room temperature part is of the cold head 1. The mounting sections 26, 27 are located at the same level with respect to the direction of the longitudinal axis LA such that the flexible sealing section 6 is not exposed to any noticeable temperature gradient but is altogether substantially at room temperature. The flexible sealing section 6 is exposed to the gas pressure of the cryocontainer 2 on its lower side and to the ambient air pressure on its upper side.

A vacuum container 4 is arranged around the cryocontainer 2, the inside of which is evacuated. A radiation shield 3 is arranged between the vacuum container wall 4a and a lower part of the cryocontainer wall 2c (it should be noted that also a plurality of radiation shields could be provided in the vacuum container 4 within the scope of the invention). A cooling stage 15 of the cold head 1 is thermally coupled to the radiation shield 3 in a contact-free fashion via two coupling elements 24, 25. The first coupling element 24 is mounted to the cooling stage 15 and the second coupling element 25 is mounted to the radiation shield 3 where the radiation shield projects through the cryocontainer wall 2c. The first coupling surface 24a of the first coupling element 24 is annularly serrated and has three projections having a triangular cross-section. The second coupling surface 25a of the second coupling element 25 is also annularly serrated and has three projections having a triangular cross-section. The flanks of the projections are all inclined with respect to the longitudinal axis LA by an angle of inclination a of approximately 20°. The projections of the coupling surfaces 24a, 25a engage into one another, wherein, however, a gap remains between the coupling surfaces 24a, 25a. The gap width SB (perpendicular to the flanks of the projections) is approximately 2 mm in this case. The coupling elements 24, 25 thus do not contact one another.

A bearing ball 9 is arranged on the flat rear side 1d of the cold head 1a. A pressure plate 10 is supported on the bearing ball 9, the pressure plate 10 being connected in a gas-tight fashion with a further flexible sealing section 7, in the present case again a rolling diaphragm, to a rigid wall part 19. The rigid wall part 19 is rigidly connected to the vacuum container wall 4a via rods 35 in the present case. A compensation chamber 8 is delimited by the rigid wall part 19, the further sealing section 7 and the pressure plate 10. The compensation chamber 8 is connected to the cryocontainer 2 via a pressure compensation line 28 such that the gas pressure in the compensation chamber 8 is the same as in the cryocontainer 2. The surface of the pressure plate 10 and the room temperature flange surface 18, which the room temperature part is of the cold head 1 also uses to seal the access opening 13, have the same size. For this reason, it is ensured that the cold head 1 is exposed to the same force from the top (via the pressure plate 10) and from below (from the cryocontainer 2) irrespective of the ambient air pressure. For this reason, the position of the cold head 1 along the longitudinal axis LA is kept constant even if the ambient air pressure fluctuates. It should be noted that the gas pressure in the cryocontainer 2 is generally kept constant. In particular, for readjustment, the gas pressure in the cryocontainer 2 can be increased by switching on (or turning up) an electric heater (not shown) and be reduced by switching off (or turning down) the electric heater. It should also be noted that the flexible sealing section 6 and the further flexible sealing section 7 may be selected to be identical in construction.

The connecting line 14 for the working gas to the cold head 1 has a contact point 29 at the cold head 1, which is located along the longitudinal axis LA slightly above the center of gravity SP of the cold head 1 and is therefore spaced apart from the center of gravity SP away from the first coupling element 24 along the longitudinal axis LA. This leads to an advantageous tilting behavior of the cold head 1 in case of pressure shocks through the connecting line 14 such that the cold head 1 has a comparatively small deflection amplitude in the area of the coupling elements 24, 25. The gap between the coupling surfaces 24a, 25a can correspondingly be selected to be relatively small which increases thermal coupling and minimizes thermal losses due to cold gas which flows to the top towards the end of the neck-tube like part 2b of the cryocontainer 2 which is at room temperature.

In summary, the cold head 1 can be mounted in a vibration-damped fashion to the vacuum container 4 via decoupling elements 5 using the cooling device 20 in accordance with the invention. The cryotank 2 is sealed with respect to the cold head 1 via an approximately tension-free flexible sealing section 6, thereby minimizing the mechanical coupling between the cryotank 2 or cryostat 23 on the one hand and the cold head 1 on the other hand. For this reason, the flexible sealing section 6 can be maintained approximately tension-free since it is only used between the environment and the cryocontainer 2. At the upper first cooling stage 15 the cold head 1 is thermally coupled in a contact-free fashion via toothed coupling surfaces 24a, 25a to a radiation shield 3 and the lower further cooling stage 16 is in the area of the main part 2a of the cryocontainer 2 above the liquid level of the contained cryogenic liquid such that no further mechanical coupling is thereby introduced.

The particular features of the illustrated inventive cooling device 20 are explained again below in more detail.

The cold head 1 is installed in the cryostat 23 such that its second further cooling stage 16 projects into the lower main part 2a of the cryocontainer (helium tank) 2 and its first cooling stage 15 cools the radiation shield 3. None of the stages 15, 16 is in mechanical contact with the cryostat 23. Thermal coupling is realized via the gas located above the coolant bath (and to a small extent via radiation). The cold head 1 is held by the decoupling elements 5, in the present case "negative stiffness" isolating elements which are, in turn, mounted to the vacuum container (outer container) 4 of the cryostat 23. The gap between the cold head 1 and the neck-tube like part 2b of the cryotank 2 in which the cold head 1 is seated is sealed via the flexible sealing section 6, in the present case a rolling diaphragm. The neck-tube like part 2b is a connection between the lower main part 2a of the cryotank 2 and the vacuum container 4.

The flexible sealing section 6 as well as the further flexible sealing section 7 explained below are designed such that they do not cause any inadmissibly high mechanical coupling between the vacuum container 4 and the cold head 1. Towards this end, the pressure difference at the diaphragm is adjusted to be relatively small, at the outside atmospheric pressure (approximately 1000 mbar), a slight overpressure in the cryocontainer 2 (approximately 1020 mbar). The pressure in the cryocontainer 2 is kept as constant as possible and is independent of the atmospheric pressure. The constant pressure in the cryocontainer 2 is important in order to keep the temperature of the coolant bath absolutely constant which is important for the stability of the generated magnetic field.

Since the decoupling elements 5, i.e. the "negative stiffness" isolating elements are very "soft" in all three spatial directions (which means that small forces cause great displacements), the unavoidable weather-induced atmospheric pressure fluctuations would result in a movement of the cold head 1 to the top or bottom (when the atmospheric pressure decreases, the cold head 1 would move to the top). In order to avoid this, the cold head 1 is pressurized by a mechanism from the top with a force which compensates for changes in the difference between the gas pressure in the cryocontainer and atmospheric pressure. This is realized by means of the compensation chamber 8 which is also sealed with a flexible sealing section (diaphragm) 7. The pressure plate 10 of the chamber 8 has the same surface as the room temperature flange of the cold head 1. The chamber 8 is rigidly fastened to the vacuum container 4 and connected to the cryocontainer 2 by means of a tube or hose such that the pressure in the chamber 8 and in the cryocontainer 2 is always the same. One or more bearing balls 9 are disposed between the cold head 1 and the pressure plate 10, which permit the cold head 1 to exercise a tilting motion relative to the pressure plate 10.

The vibration-isolating properties of the flexible sealing section 6 are even better with tilting motions than with translatory motions. When a force is exerted by the connecting line (rotary valve line) 14 onto the room temperature part is of the cold head 1, the cold head 1 turns about a point which is approximately in the center of the room temperature flange. This turning motion is only possible since the cold head 1 can roll at the top on the ball 9 and over the pressure plate 10.

The gas pressure in the cryocontainer 2 of this construction should always be above atmospheric pressure. This prevents introduction of impurities (e.g. air) in case of operating errors or in case of leakage. Moreover, the pressure plate 10 may be lifted off the bearing ball 9 if the gas pressure in the cryocontainer 2 is too small.

Figure 3:
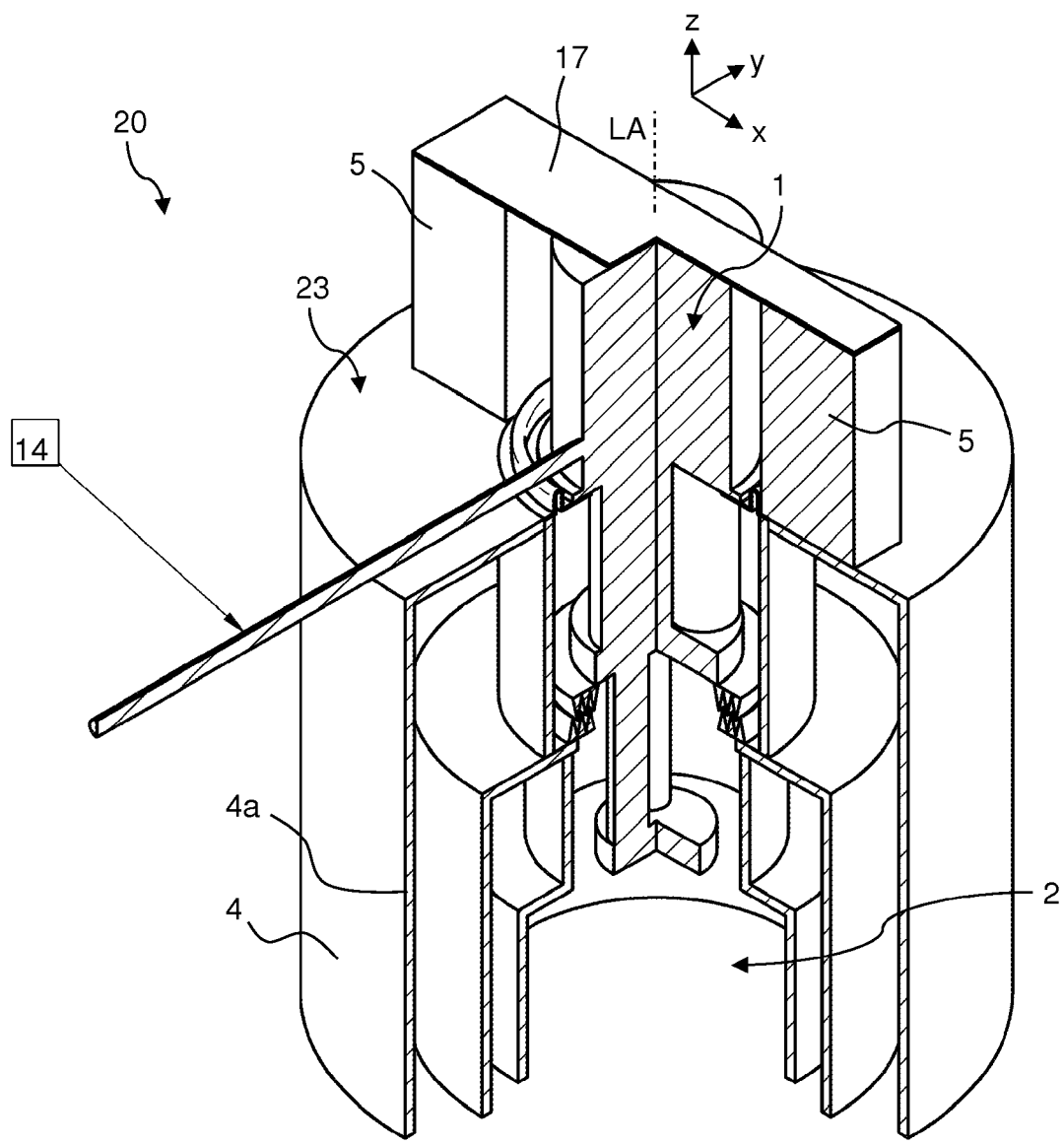
FIG. 3 shows a schematic, partially cut inclined view of an embodiment of an inventive cooling device with a cold head which is fixed in the direction along the longitudinal axis.

FIG. 3 shows a further embodiment of an inventive cooling device 20 similar to the embodiment of FIGS. 2a and 2b such that only the differences are explained below.

The cooling device 20 comprises a cold head 1 which is rigidly mounted to decoupling elements 5 via rods 17, wherein the decoupling elements 5 are, in turn, mounted to the cryostat 23 or its vacuum container wall 4a. In this case, the decoupling elements 5 only permit movement of the rods 17 relative to the cryostat 23, and therefore vibration decoupling of the cold head 1, in the directions x, y perpendicular to the longitudinal axis LA but not in the direction z parallel to the longitudinal axis LA.

For this reason, the connecting line 14 of this embodiment must extend or be coupled in a straight line and perpendicular to the longitudinal axis LA such that forces which are transmitted with the connecting line 14 to the cold head 1 through pressure shocks of the working gas do not lift or lower the cold head 1. These forces would trigger vibration along the longitudinal axis LA of the overall cryostat 23. Application of force perpendicular to the longitudinal axis LA can be easily prevented by supporting the control valve (rotary valve) on a support of the correct size (cf. in this case FIG. 1, reference numeral 22).

We claim:

1. A cooling device comprising:
    a cold head or a cold head of a pulse tube cooler, said cold head having a room temperature part and a cooling arm; and
    a cryostat having an access opening, said cryostat comprising:
        a vacuum container having a vacuum container wall, wherein said vacuum container wall seals off a vacuum inside said vacuum container from an environment;
        a cryocontainer disposed within said vacuum container, said cryocontainer structured to keep a cryogenic liquid and/or a cryogenic gas, said cryocontainer having a cryocontainer wall, wherein said cryocontainer wall seals off an inside of said cryocontainer from said vacuum of said vacuum container;
        decoupling elements disposed between said room temperature part of said cold head and said vacuum container wall, thereby mounting said room temperature part to said vacuum container wall in a vibration-damped fashion, wherein said cooling arm of said cold head projects along a longitudinal axis through said access opening of said cryostat and into said cryocontainer; and
        a flexible sealing section disposed between said vacuum container wall and said room temperature part, thereby directly or indirectly connecting said vacuum container wall to said room temperature part of said cold head, wherein said flexible sealing section seals off said inside of the cryocontainer from the environment.

2. The cooling device of claim 1, wherein said cryocontainer is structured to contain liquid helium and gaseous helium at a pressure of between 950 mbar and 1100 mbar or of between 1015 mbar and 1050 mbar.

3. The cooling device of claim 1, wherein said flexible sealing section connects a first mounting section on said vacuum container wall to a second mounting section on said room temperature part of said cold head, which are arranged at approximately a same level with respect to said longitudinal axis.

4. The cooling device of claim 1, wherein said vacuum container wall is completely rigid.

5. The cooling device of claim 1, wherein said flexible sealing section is formed by a plastic diaphragm of an elastomeric material or of rubber.

6. The cooling device of claim 1, wherein said flexible sealing section is a rolling diaphragm.

7. The cooling device of claim 1, further comprising a radiation shield disposed in said vacuum container between said vacuum container wall and said cryocontainer wall, wherein a cooling stage of said cooling arm is thermally coupled to said radiation shield, said cooling stage having a first coupling element with a first coupling surface and said radiation shield having a second coupling element with a second coupling surface, said first and said second coupling surfaces being located opposite to each other in said cryocontainer, such that a gap remains between said first and the second coupling element.

8. The cooling device of claim 7, wherein, in order to increase thermal coupling, said first coupling surface has axial projections and/or recesses and said second coupling surface has mirror-inverted axial recesses and/or projections.

9. The cooling device of claim 8, wherein said first coupling surface has an axially symmetrical toothing with annular, axial projections and recesses and said second coupling surface has a mirror-inverted axially symmetrical toothing with annular axial recesses and projections.

10. The cooling device of claim 9, wherein said annular axial projections and recesses have a triangular shape in longitudinal section or a triangular shape with an angle of inclination relative to said longitudinal axis of between 10° and 30°.

11. The cooling device of claim 7, wherein, when said cold head is not deflected, a gap width in a direction in which a separation between said first and the second coupling surface is minimum, is between 0.8 mm and 4.0 mm.

12. The cooling device of claim 1, wherein said decoupling elements are loaded with said cold head and have an eigenfrequency f0, with f0≤0.75 Hz or f0≤0.5 Hz.

13. The cooling device of claim 1, wherein said decoupling elements minimize excitation of said cryostat by said cold head in only two orthogonal directions perpendicular to said longitudinal axis, and further comprising a control valve connected to said cold head via a connecting line, wherein said connecting line is exclusively straight and perpendicular to said longitudinal axis.

14. The cooling device of claim 1, wherein said decoupling elements minimize excitation of said cryostat by said cold head both in two orthogonal directions perpendicular to said longitudinal axis as well as movement of the cold head parallel to said longitudinal axis.

15. The cooling device of claim 14, further comprising a compensation chamber disposed on said cooling device and delimited by a rigid wall part, a further flexible sealing section or a further rolling diaphragm, and a pressure plate held by of said flexible sealing section, wherein said rigid wall part is rigidly connected to said vacuum container wall of said cryostat and said pressure plate is mechanically coupled to said cold head along said longitudinal axis or is formed by said cold head, said pressure plate being disposed opposite a room temperature flange surface of said cold head which also seals said access opening and moreover further comprising a mechanism for adjusting a pressure in said compensation chamber in dependence on a pressure in the cryocontainer or for adjusting said pressure in said compensation chamber to be equal to said pressure in said cryocontainer.

16. The cooling device of claim 15, wherein said mechanism for adjustment comprises a pressure compensation line which connects said cryocontainer to said compensation chamber.

17. The cooling device of claim 15, wherein a surface of said pressure plate and a room temperature flange surface of said cold head are of substantially equal size and are arranged parallel to one another.

18. The cooling device of claim 15, wherein said pressure plate is separate from said cold head and further comprising a rolling member or a rolling member formed by one or a plurality of bearing balls and disposed between said pressure plate and a rear side of said cold head.

19. The cooling device of claim 1, further comprising a control valve and a connecting line disposed between said control valve and said cold head, said control valve being connected to said cold head at a contact point, wherein said contact point is spaced apart from a center of gravity of said cold head in a direction of said longitudinal axis facing away from said coupling element.

20. The cooling device of claim 1, further comprising a radiation shield, wherein said cold head has a cooling stage and a further, colder cooling stage, wherein said cooling stage is substantially at a position of said radiation shield in a direction of said longitudinal axis and said further, colder cooling stage projects further into said cryocontainer than said cooling stage.

21. The cooling device of claim 1, wherein said decoupling elements are designed as negative stiffness isolating elements.

22. A method for using the cooling device of claim 1 in an NMR measurement configuration, wherein the cryocontainer contains a magnet coil and a sample is located in a room temperature bore of said cryostat, wherein the sample is subjected to an NMR measurement or to an NMR measurement in which an NMR spectrum of the sample is recorded.

* * * * *